United States Patent
Meyer et al.

(10) Patent No.: US 8,058,081 B2
(45) Date of Patent: Nov. 15, 2011

(54) METHOD OF TESTING AN INTEGRITY OF A MATERIAL LAYER IN A SEMICONDUCTOR STRUCTURE

(75) Inventors: Moritz Andreas Meyer, Dresden (DE); Eckhard Langer, Radebeul (DE); Frank Koschinsky, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 912 days.

(21) Appl. No.: 11/777,355

(22) Filed: Jul. 13, 2007

(65) Prior Publication Data
US 2008/0160654 A1    Jul. 3, 2008

(30) Foreign Application Priority Data
Dec. 29, 2006    (DE) .................. 10 2006 062 015

(51) Int. Cl.
*H01L 21/66* (2006.01)
(52) U.S. Cl. .............. 438/16; 438/627; 257/E21.527
(58) Field of Classification Search .............. 438/8, 627, 438/16; 257/E21.527
See application file for complete search history.

(56) References Cited

U.S. PATENT DOCUMENTS

| | | | |
|---|---|---|---|
| 4,419,385 A | 12/1983 | Peters | 427/99 |
| 6,331,490 B1 * | 12/2001 | Stevens et al. | 438/754 |
| 6,964,874 B2 * | 11/2005 | Werner et al. | 438/14 |
| 7,141,179 B2 * | 11/2006 | Weng et al. | 216/84 |
| 7,348,190 B2 * | 3/2008 | Shin et al. | 438/15 |
| 7,498,181 B2 * | 3/2009 | Klibanov et al. | 438/16 |
| 2004/0029051 A1 | 2/2004 | Koita et al. | 430/313 |

FOREIGN PATENT DOCUMENTS

| | | |
|---|---|---|
| DE | 103 41 544 B4 | 10/2005 |
| DE | 101 22 136 B4 | 9/2006 |
| DE | 101 53 763 B4 | 9/2006 |
| JP | 06069307 A | 3/1994 |
| WO | WO 2006/010091 A2 | 1/2006 |

OTHER PUBLICATIONS

Translation of Official Communication from German Patent Office for German Patent Application No. 10 2006 062 015.1 dated Mar. 18, 2010.

* cited by examiner

*Primary Examiner* — Matthew Landau
*Assistant Examiner* — Sun M Kim
(74) *Attorney, Agent, or Firm* — Williams, Morgan & Amerson, P.C.

(57) ABSTRACT

A method comprises providing a semiconductor structure. The semiconductor structure comprises a feature comprising a first material and a layer of a second material formed over the feature. The semiconductor structure is exposed to an etchant. The etchant is adapted to selectively remove the first material, leaving the second material substantially intact. After exposing the semiconductor structure to the etchant, it is detected whether the feature has been affected by the etchant.

18 Claims, 4 Drawing Sheets

METHOD OF TESTING AN INTEGRITY OF A MATERIAL LAYER IN A SEMICONDUCTOR STRUCTURE

BACKGROUND OF THE INVENTION

1. Field of the Invention

The present disclosure generally relates to the fabrication of integrated circuits, and, more particularly, to methods of testing an integrity of a material layer provided in a semiconductor structure.

2. Description of the Related Art

Integrated circuits comprise a large number of individual circuit elements, e.g., transistors, capacitors and resistors, formed on and in a substrate. These elements are connected internally by means of electrically conductive lines to form complex circuits, such as memory devices, logic devices and microprocessors. To accommodate all the electrically conductive lines required to connect the circuit elements in modern integrated circuits, the electrically conductive lines are arranged in a plurality of levels stacked on top of each other. To connect electrically conductive lines provided in different levels, contact vias are formed in dielectric layers separating the levels from each other. These vias are then filled with an electrically conductive material.

A method of forming an electrically conductive line according to the state of the art will now be described with reference to FIGS. 1a and 1b. FIG. 1a shows a schematic cross-sectional view of a semiconductor structure 100 in a first stage of the method of forming an electrically conductive line according to the state of the art. A semiconductor substrate 101 is provided. The semiconductor substrate 101 may comprise a plurality of circuit elements and, optionally, electrically conductive lines in lower interconnect levels. The semiconductor substrate 101 further comprises a first dielectric layer 102 formed thereon. A trench 107 is formed in the dielectric layer 102. A trench fill 111 comprising an electrically conductive material, e.g., a metal, such as copper, is provided in the trench 107. The trench fill 111 forms an electrically conductive line. A diffusion barrier layer 110 separates the trench fill 111 from the first dielectric layer 102. Thus, a diffusion of the material of the trench fill 111 into the first dielectric layer 102 can be prevented and adhesion between the trench fill 111 and the dielectric material of the first dielectric layer 102 can be improved. The semiconductor substrate 101 can be formed by means of methods known to persons skilled in the art comprising advanced techniques of deposition, oxidation, ion implantation, etching and photolithography.

An etch stop layer 103 is formed over the semiconductor substrate 101. In addition to the surface of the first dielectric layer 102, the etch stop layer 103 covers an exposed top surface of the trench fill 111. On the etch stop layer 103, a second dielectric layer 104 is formed. The second dielectric layer 104 may comprise the same material as the first dielectric layer 102. The etch stop layer 103 and the second dielectric layer 104 may be formed by means of methods known to persons skilled in the art, such as chemical vapor deposition (CVD), plasma enhanced chemical vapor deposition (PECVD) and spin coating.

A trench 109 and a contact via 108 are formed in the second dielectric layer 104. This can be done by photolithographically forming a mask (not shown) which exposes a portion of the surface of the second dielectric layer 104 at the location where the contact via 108 is to be formed. Then, an etching process is performed. To this end, the semiconductor structure 100 is exposed to an etchant adapted to selectively remove the material of the second dielectric layer 104, leaving the etch stop layer 103 essentially intact. Thus, the etching process stops as soon as the etch front reaches the etch stop layer 103.

The etching process may be anisotropic. In anisotropic etching, a rate at which material is removed from the etched surface depends on the orientation of the surface. In an anisotropic etching process, the etch rate of substantially horizontal portions of the etched surface being substantially parallel to the surface of the semiconductor substrate 101 is significantly greater than the etch rate of inclined portions of the etched surface. Thus, substantially no material below the mask is removed and the via 108 obtains substantially vertical sidewalls. Thereafter, the mask is removed, which can be done by means of a resist strip process known to persons skilled in the art, and the trench 109 is formed. Similar to the formation of the contact via 108, the trench 109 can be formed by photolithographically forming a mask on the semiconductor structure 100 and performing an anisotropic etching process.

Subsequently, a portion of the etch stop layer 103 exposed at the bottom of the contact via 108 is removed. The exposed portion of the etch stop layer 103 may be removed by means of an etching process adapted to selectively remove the material of the etch stop layer 103, leaving the materials of the second dielectric layer 104 and the trench fill 111 substantially intact.

A diffusion barrier layer 105 is deposited on the semiconductor structure 100. In particular, the diffusion barrier layer 105 covers the sidewalls and the bottom of the trench 109 and the contact via 108. This can be done by means of known methods such as CVD, PECVD and/or sputter deposition. Then, a layer 106 of an electrically conductive material, e.g., copper, is formed on the diffusion barrier layer 105. To this end, methods of electroplating known to persons skilled in the art may be employed.

The diffusion barrier layer 105 may comprise materials such as titanium nitride, tantalum and/or tantalum nitride which may prevent a diffusion of the electrically conductive material of the layer 206 into the second dielectric layer 104 and other portions of the semiconductor structure 100. In particular, in methods of forming an electrically conductive line according to the state of the art wherein the electrically conductive material comprises copper, the diffusion barrier layer 105 may prevent a diffusion of copper into circuit elements such as field effect transistors formed in the semiconductor structure 100. This may help avoid adverse effects of the presence of copper on the functionality of the field effect transistors.

FIG. 1b shows a schematic cross-sectional view of the semiconductor structure 100 in a later stage of the method of forming an electrically conductive line according to the state of the art. The surface of the semiconductor structure 100 is planarized, for example, by means of a known chemical mechanical polishing (CMP) process. In the planarization, portions of the diffusion barrier layer 105 and the layer 106 outside the trench 109 and the contact via 108 are removed and a planar surface of the semiconductor structure 100 is obtained. Residues of the layer 106 in the trench 109 form an electrically conductive line. Residues of the layer 106 in the contact via 108 provide an electrical contact between the electrically conductive lines in the trench 109 and the trench 107.

A problem of the above-described method of forming an electrically conductive line according to the state of the art is that the diffusion barrier layer 105 may comprise one or more pores 112. During the formation of the layer 106 of electrically conductive material, the presence of the pore 112 may induce an insufficient filling of the contact via 108 with the electrically conductive material such that a void 113 is created in the layer 106.

If the semiconductor structure 100 is operated after the completion of the manufacturing process, the void 113 may increase the electrical resistance of the electrically conductive line formed in the contact via 108. Additionally, the presence of the void 113 may increase the likelihood of electromigration and/or stress migration occurring.

As persons skilled in the art know, the term "electromigration" denotes a current-induced transport of atoms in conductors. Electrons moving in an electrical field exchange momentum with the atoms. At high current densities, the momentum imparted to the atoms forms a net force which is high enough to propel atoms away from their sites in the crystal lattice. Thus, the atoms pile up in the direction of electron flow. The likelihood of electromigration is dependent, inter alia, on temperature, wherein moderately high temperatures increase the likelihood of electromigration occurring.

Moreover, undesirable material transport in semiconductor structures may be caused by mechanical stress which can be created, for example, due to different thermal expansion coefficients of materials present in the semiconductor structure 100. Such stress may relax via a diffusion of atoms in the electrically conductive line. The diffusion of atoms entails a transport of material. This phenomenon is denoted as "stress migration."

In the void 113, there is a surface of the material of the layer 106. At the surface, there is a greater likelihood of electromigration occurring than in other portions of the electrically conductive line in the contact via 108 and/or in the trench, since the material at the surface of the layer 106 is not confined by the barrier layer 108 and/or other elements of the semiconductor structure 100. In the course of time, electromigration and/or stress migration may negatively affect or even destroy the electrically conductive line formed in the contact via 108.

Therefore, it is desirable to develop methods of forming a diffusion barrier layer which eliminates or at least reduces the likelihood of the formation of pores. Methods which allow testing the integrity of a diffusion barrier layer are helpful for this purpose.

In the state of the art, it has been proposed to investigate a diffusion barrier layer by means of transmission electron microscopy. For this purpose, a sample comprising a thin section of a semiconductor structure similar to the semiconductor structure 100 described above is employed. A problem of this technique, however, is that the preparation of samples adapted for transmission electron microscopy, as well as transmission electron microscopy itself, are difficult to perform and are time-consuming. This may restrict the number of contact vias which can be investigated in an economically feasible manner, and may impose difficulties in implementing routine or in-line processes for testing the integrity of the diffusion barrier layer.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one illustrative embodiment disclosed herein, a method comprises providing a semiconductor structure. The semiconductor structure comprises a feature comprising a first material and a layer comprising a second material formed over the feature. The semiconductor structure is exposed to an etchant. The etchant is adapted to selectively remove the first material relative to the second material. After exposing the semiconductor structure to the etchant, it is detected whether the feature has been etched by the etchant.

According to another illustrative embodiment disclosed herein, a method comprises providing a semiconductor structure. The semiconductor structure comprises a substrate. An electrically conductive feature is formed in the substrate. The electrically conductive feature comprises a first material. A dielectric layer is formed over the substrate. A contact via is formed in the dielectric layer. A barrier layer is formed over at least a portion of the feature exposed at a bottom of the contact via. The barrier layer comprises a second material. The semiconductor structure is exposed to an etchant. The etchant is adapted to selectively remove the first material relative to the second material. After exposing the semiconductor structure to the etchant, it is detected whether the feature has been etched by the etchant.

BRIEF DESCRIPTION OF THE DRAWINGS

The disclosure may be understood by reference to the following description taken in conjunction with the accompanying drawings, in which like reference numerals identify like elements, and in which.

Figure 1A:
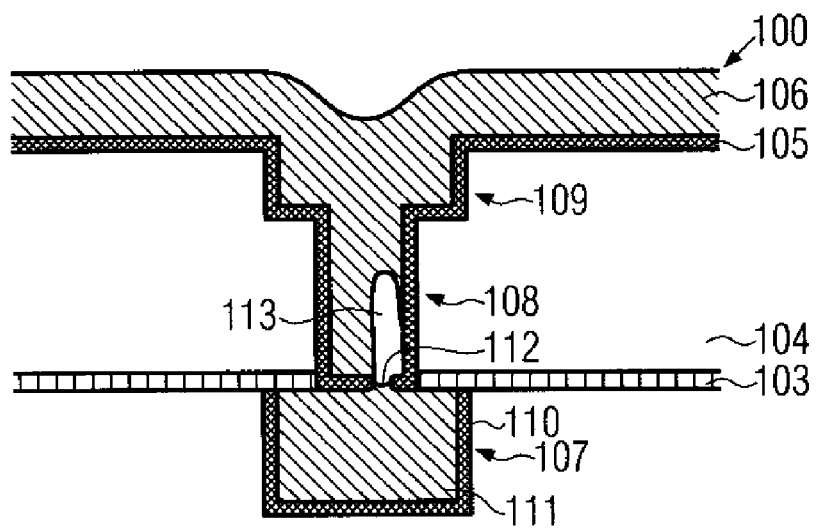
FIGS. 1a-1b show schematic cross-sectional views of a semiconductor structure in stages of a method of forming a semiconductor structure according to the state of the art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to one illustrative embodiment disclosed herein, a semiconductor structure comprising a feature which comprises a first material is provided. The feature may, for example, comprise a trench filled with the first material. Over the feature, a layer comprising a second material is formed which may, for example, be a diffusion barrier layer comprising titanium, titanium nitride, tantalum and/or tantalum nitride.

Thereafter, the semiconductor structure is exposed to an etchant adapted to selectively remove the first material, leaving the second material substantially intact. In some embodiments, the first material may comprise copper and the etchant may be comprised of an aqueous solution of a chemical compound capable of etching copper, e.g., ammoniumperoxidisulfate and/or iron(III)-chloride. In other embodiments, a dry etching process adapted to selectively etch the first material may be employed.

In case the layer comprising the second material comprises pores, the etchant may contact the first material in the feature. Thus, the feature is affected by the etchant and a portion of the feature may be etched away, which may, in some embodiments, lead to the formation of a cavity in the feature. Conversely, if the layer of the second material is intact and does not comprise pores, the layer comprising the second material may prevent a contact between the etchant and the first material in the feature below the layer. Thus, the feature is protected from being affected by the etchant and no cavity is formed.

After exposing the semiconductor structure to the etchant, it is detected whether the feature has been affected by the etchant. For this purpose, scanning electron microscopy and/or optical microscopy may be employed. If the feature bears traces of affection by the etchant, such as a cavity, the layer of the second material formed over the feature may be classified as porous. Conversely, if the feature is intact, the layer of the second material may be classified as intact.

Figure 2A:
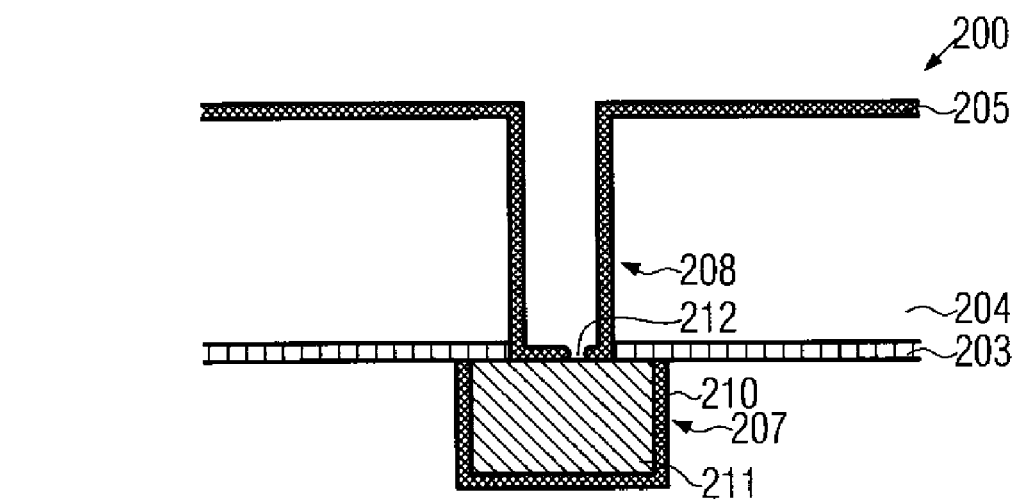
FIGS. 2a-2b show schematic cross-sectional views of a semiconductor structure in stages of a method according to one illustrative embodiment disclosed herein.

FIG. 2a shows a schematic cross-sectional view of a semiconductor structure 200 in a first stage of a method according to one illustrative embodiment disclosed herein. The semiconductor structure 200 comprises a substrate 201 which may, in some embodiments, be comprised of a semiconductor material, for example silicon. A first dielectric layer 202 is formed on the substrate 201. The first dielectric layer 202 may comprise silicon dioxide, silicon nitride and/or silicon oxynitride. The first dielectric layer 202 may be formed by means of a deposition process well known to persons skilled in the art, for example, chemical vapor deposition (CVD) and/or physical vapor deposition (PVD).

A trench 207 is formed in the first dielectric layer 202. To this end, a mask (not shown), which may, for example, comprise a photoresist, may be formed over the semiconductor structure 200 using techniques of photolithography well known to persons skilled in the art. The mask may have an opening at the location where the trench 207 is to be formed. Thereafter, a well-known etching process adapted to selectively remove the material of the first dielectric layer 202, leaving the material of the mask substantially intact, is performed. Subsequently, the mask may be removed.

A diffusion barrier layer 210 is formed over the first dielectric layer 202. The diffusion barrier layer 210 may be formed by means of processes of chemical vapor deposition and/or plasma enhanced chemical vapor deposition well known to persons skilled in the art. In some embodiments, the diffusion barrier may comprise titanium, titanium nitride, tantalum and/or tantalum nitride.

Thereafter, a layer 211 comprised of a first material is deposited over the semiconductor structure 200. In some embodiments, the first material may comprise copper. In such embodiments, the layer 211 may be formed by means of an electroplating process. As persons skilled in the art know, in electroplating, the semiconductor structure 200 is inserted into a plating solution comprising a copper salt, for example, copper sulfate ($CuSO_4$). Thereafter, an electric voltage is applied between the semiconductor structure 200 and a copper electrode provided in the plating solution. A polarity of the voltage is such that, at least on average, the semiconductor structure 200 becomes a cathode and the electrode becomes an anode. Thus, at the semiconductor structure 200, copper ions change from an electrically charged state in the plating solution into the solid state and form the layer 211. At the electrode, copper atoms are electrically charged and change from the solid state into the dissolved state. In some embodiments, a seed layer (not shown) may be formed before the electroplating process, for example by means of a process of sputtering and/or electroless plating well known to persons skilled in the art.

After the formation of the layer 211 comprising the first material, a planarization process may be performed to remove portions of the diffusion barrier layer 210 and the layer 211 outside the trench 207.

In some embodiments, the planarization process may comprise chemical mechanical polishing. As persons skilled in the art know, in chemical mechanical polishing, the semiconductor structure 200 is moved relative to a polishing pad. A slurry is supplied to an interface between the semiconductor structure 200 and the polishing pad. The slurry comprises chemical compounds adapted to react with materials on the surface of the semiconductor structure 200, in particular with the material of the diffusion barrier layer 210 and the layer 211. The reaction product is removed by abrasives in the slurry and/or the polishing pad. Thus, a planar surface of the semiconductor structure 200 is obtained. The chemical mechanical polishing process may be stopped as soon as the first dielectric layer 202 is exposed adjacent the trench 207.

The trench 207 filled with the first material of the layer 211 forms a feature comprising the first material.

Thereafter, an etch stop layer 203 may be formed over the semiconductor structure 200. The etch stop layer 203 may comprise a different material than the first dielectric layer 202. For example, in embodiments wherein the first dielectric layer 202 comprises silicon dioxide, the etch stop layer 203 may comprise silicon nitride. Conversely, in embodiments wherein the first dielectric layer 202 comprises silicon nitride, the etch stop layer 203 may comprise silicon dioxide.

A second dielectric layer 204 is formed over the etch stop layer 203, for example, by means of a known process of chemical vapor deposition and/or plasma enhanced chemical vapor deposition. In some embodiments, the second dielectric layer 204 may be formed of substantially the same material as the first dielectric layer 202.

A contact via 208 is formed in the second dielectric layer 204. For this purpose, a mask (not shown) having an opening at the location at which the contact via 208 is to be formed may be formed over the semiconductor structure. The mask may comprise a photoresist and may be formed by means of techniques of photolithography well known to persons skilled in the art. Thereafter, an anisotropic etching process adapted to selectively remove the material of the second dielectric layer 204, leaving the material of the etch stop layer 203 substantially intact, is performed. Thus, the etching process stops as soon as the etch stop layer 203 is exposed at the bottom of the contact via 208. Subsequently, a portion of the etch stop layer 203 at the bottom of the contact via 208 may be removed, for example, by means of a known etching process to expose a portion of the layer 211 at the bottom of the contact via 208.

After the formation of the contact via 208, a layer 205 comprising a second material may be formed over the semiconductor structure 200. In some embodiments, the layer 205 may be formed by means of a process of chemical vapor deposition and/or plasma enhanced chemical vapor deposition.

In some embodiments, the second material may be a material adapted to substantially prevent a diffusion of copper through the layer 205, for example, titanium, titanium nitride, tantalum and/or tantalum nitride. The layer 205 need not be provided in the form of a single material layer. In other embodiments, the layer 205 may comprise a plurality of sub-layers comprised of different materials, wherein one of the sub-layers, for example the topmost sublayer, having the greatest distance from the second dielectric layer 204 is comprised of the second material. In some embodiments, the layer 205 may have a composition similar to that of a diffusion barrier layer known to persons skilled in the art.

Figure 1B:
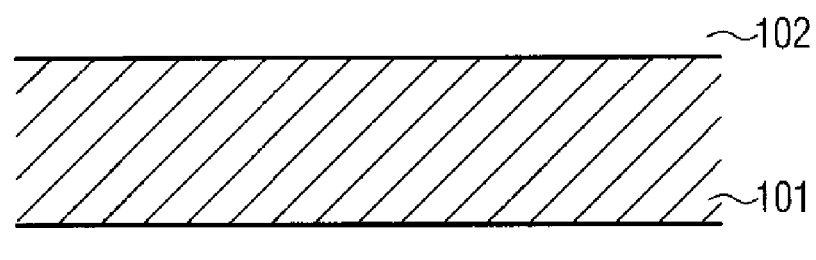

Similar to the method of manufacturing a semiconductor structure according to the state of the art described above with reference to FIGS. 1*a*-1*b*, the layer 205 comprising the second material may comprise a pore 212 located at the bottom surface of the contact via above the trench 207.

The present invention is not restricted to embodiments wherein the layer 205 is deposited after the formation of the contact via 208. In other embodiments, the formation of the etch stop layer 203 and the second dielectric layer 204 may be omitted and a layer comprising the second material similar to the layer 205 may be deposited after performing the planarization process to remove portions of the diffusion barrier layer 210 and the layer 211 outside the trench 207. Thus, a substantially planar layer comprising the second material may be obtained. Advantageously, this may allow reducing the number of processes of deposition and etching performed in the method disclosed herein.

Forming the layer 205 comprising the second material after the formation of the contact via 208, however, may allow the properties of the layer 205 to more closely resemble the properties of a diffusion barrier layer provided in a semiconductor structure comprising electrically conductive lines.

Figure 2B:
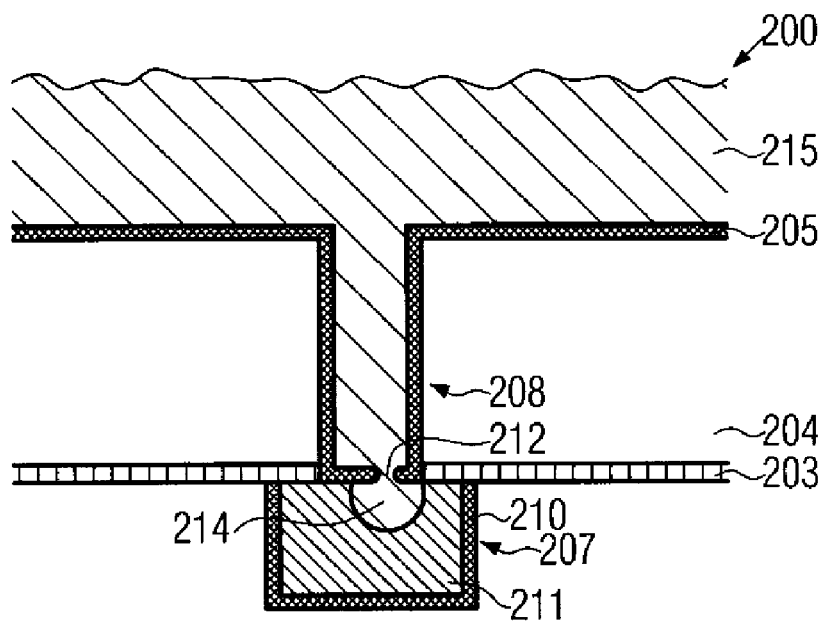

FIG. 2*b* shows a schematic cross-sectional view of the semiconductor structure 200 in a later stage of the manufacturing process. After the formation of the layer 205 comprising the second material, the semiconductor structure 200 is exposed to an etchant 215 adapted to selectively remove the first material, leaving the layer 205 comprising the second material substantially intact.

In some embodiments, a wet etching process may be performed. In such embodiments, the etchant 215 may comprise a solution of a chemical compound adapted to selectively etch the first material provided in the trench 207. In embodiments wherein the first material comprises copper, the etchant 215 may comprise an aqueous solution of ammoniumperoxidisulfate. Alternatively, an aqueous solution of iron(III)-chloride may be used.

In some embodiments, the semiconductor structure 200 may be exposed to the etchant 215 by inserting the semiconductor structure 200 into a container wherein the etchant 215 is provided. In other embodiments, the etchant 215 may be sprayed to the semiconductor structure 200.

The present invention is not restricted to embodiments wherein the etchant 215 is provided in liquid form. In other embodiments, a dry etching process may be performed.

As persons skilled in the art know, in dry etching, which is also known as plasma etching or ion-enhanced etching, the semiconductor structure 200 may be provided in a reactor vessel. A reactant gas is supplied to the reactor vessel. In the reactant gas, a glow discharge may be created by applying a radio frequency alternating voltage between the semiconductor structure 200 and an electrode provided in the reactant gas. Additionally, a bias voltage, which may be a direct voltage or a low frequency alternating voltage, may be applied between the semiconductor structure 200 and the electrode. In the glow discharge, chemically reactive species, such as atoms, ions and/or radicals, are created from the reactant gas. The chemically reactive species reacts with the first material, forming a volatile reaction product which may be pumped out of the reactor vessel. The selectivity of the etching process may be controlled by correspondingly adapting the composition of the reactant gas and other parameters of the etching process, such as temperature and pressure as well as power and frequency of the radio-frequency alternating voltage and the bias voltage. In embodiments wherein the first material comprises copper, the reactant gas may comprise, for instance, fluorine or a chemical compound comprising fluorine.

If the layer 205 comprised of the second material comprises a pore 212 at the bottom of the contact via 208, the etchant 215 may penetrate the pore 212 and contact the first material of the layer 211. Thus, a portion of the layer 211 is etched away and a cavity 214 is formed in the layer 211. A duration of the etching process and a concentration of the etchant employed may be adapted such that the cavity 214 obtains a size which may be detected by means of at least one of scanning electron microscopy and/or optical microscopy. In one embodiment, the cavity 214 may have a diameter in a range from about several angstroms to several nanometers.

In some embodiments, the etchant may be adapted such that the first material of the layer 211 is etched substantially isotropically. Substantially isotropic etching may, in particular, be obtained in embodiments wherein a wet etching process is performed. In embodiments wherein exposing the semiconductor structure 200 to an etchant comprises performing a dry etching process, substantially isotropic etching may be obtained by controlling parameters of the etching process. In particular, applying a low bias voltage may help increase the degree of isotropy of the etching process. In other embodiments, an anisotropic etching process may be performed.

Due to the selectivity of the etching process, the layer 205 comprising the second material may not be substantially affected by the etchant. Therefore, in the absence of pores 212, the layer 205 may substantially prevent contact between the etchant and the first material in the layer 211. Thus, in the absence of pores, the layer 211 is not substantially affected by the etchant and no cavity 214 is formed. Hence, the presence of the cavity 214 may indicate the presence of at least one pore 212 in the layer 205.

After exposing the semiconductor structure 200 to the etchant 215, it may be detected whether the layer 211 comprising the first material has been affected by the etchant. In particular, it may be detected whether the layer 211 comprises the cavity 214.

To this end, the semiconductor structure 200 may be investigated by means of techniques of microscopy well known to persons skilled in the art. In particular, scanning electron microscopy and optical microscopy may be employed. In other embodiments, transmission electron microscopy may be used.

In some embodiments, the semiconductor structure 200 may be investigated by viewing the semiconductor structure 200 from a direction substantially parallel to a surface of the substrate 201. Thus, the cavity 214 may be viewed through the contact via 208. In some embodiments, the second material of the layer 205 may be transparent for electrons and/or light used in the inspection of the semiconductor structure 200. Thus, the cavity 214 may be viewed through the layer 205. In other embodiments, an etching process adapted to selectively remove the second material of the layer 205, leaving the first material of the layer 211 substantially intact, may be performed before the inspection of the semiconductor structure 200.

In further embodiments, a dissection of the semiconductor structure 200 may be performed prior to detecting whether the layer 211 comprising the first material has been affected by the etchant. In some embodiments, the dissection of the semiconductor structure 200 may comprise cutting the semiconductor structure 200 along a cutting plane being substantially perpendicular to a surface of the substrate 201 and intersecting the layer 211 and/or the contact via 208. For example, the semiconductor structure 200 may be cut along a plane corresponding to the plane of drawing of FIG. 2b.

In order to cut the semiconductor structure 200, a sawing process may be performed which is similar to that employed in die separation processes well known to persons skilled in the art. To this end, the semiconductor structure 200 may be mounted to a flexible tape which may, for example, comprise Mylar. Thereafter, a substantially circular, diamond-impregnated dicing saw may be rotated and moved across the semiconductor structure 200 along the cutting plane. Subsequently, following a removal of the semiconductor structure 200 from the flexible tape, the semiconductor structure 200 may be inspected by means of microscopy, wherein the semiconductor structure 200 may be viewed from a direction substantially perpendicular to the cutting plane.

In some embodiments, the semiconductor structure 200 may comprise a plurality of integrated circuits in addition to the features described above with reference to FIGS. 2a and 2b. The trench 207 and the contact via 208 may be provided adjacent a scribe line where the semiconductor structure 200 is cut after the completion of the manufacturing process. The formation of the first dielectric layer 202, the trench 207, the diffusion barrier layer 210, the layer 211, the etch stop layer 203, the second dielectric layer 204 and the layer 205 may be performed simultaneously to the manufacturing of circuit elements of the integrated circuits. In particular, these features may be manufactured simultaneously to the formation of electrically conductive lines connecting circuit elements of the integrated circuits. When the semiconductor structure 200 is exposed to the etchant 215, the integrated circuits may be covered by a mask which may, for example, comprise a photoresist in order to protect the integrated circuits from being affected by the etchant. In a die separation process performed after the completion of the manufacturing of the semiconductor structure 200, the trench 207, which may comprise the cavity 214, may be dissected and an inspection of the trench 207 may be subsequently performed.

Thus, the steps of the method according to the present disclosure may be performed during manufacturing of integrated circuits on the substrate 201. This may help reduce the time and cost required for testing the integrity of the layer 205 comprising the second material.

In other embodiments, the semiconductor structure 200 may be a test structure which need not comprise integrated circuits.

In further embodiments, a chemical mechanical polishing process may be performed after exposing the semiconductor structure 200 to the etchant 215. The chemical mechanical polishing process may be adapted to remove the layer 205 of the second material, the second dielectric layer 204 and the etch stop layer 203. Thus, in the chemical mechanical polishing process, the cavity 214 may be exposed.

The inspection of the semiconductor structure 200 performed in order to detect whether the layer 211 of the first material has been affected by the etchant may be performed in an automated manner wherein images obtained by means of optical and/or electron microscopy are analyzed by means of image processing techniques well known to persons skilled in the art. In other embodiments, images obtained by means of microscopy may be inspected by an operator.

Figure 3A:
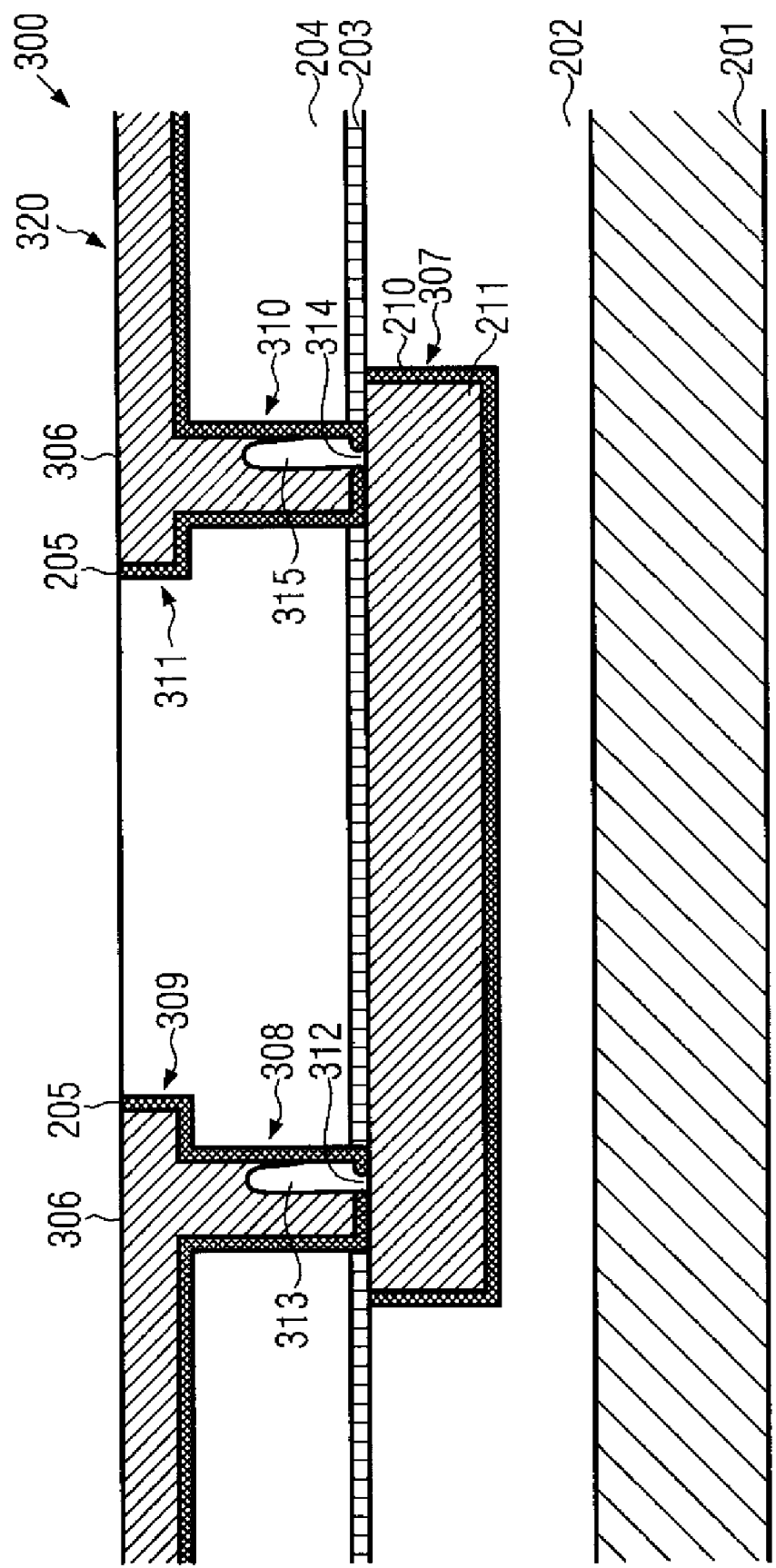
FIGS. 3a-3b show schematic cross-sectional views of a semiconductor structure in stages of a method according to another illustrative embodiment disclosed herein.

FIG. 3a shows a schematic cross-sectional view of a semiconductor structure 300 in a first stage of a method according to the present disclosure. Similar to the semiconductor structure 200 described above with reference to FIGS. 2a-2b, the semiconductor structure 300 comprises a substrate 201. A first dielectric layer 202 is formed on the substrate 201. A trench 307 is formed in the first dielectric layer 202. The trench 307 extends along a length direction being substantially parallel to the plane of drawing of FIG. 3a. A layer 211 comprising a first material and a diffusion barrier layer 210 separating the first material from the first dielectric layer 202 are formed in the trench 307. An etch stop layer 203, which may comprise a different material than the first dielectric layer 202, is formed on the first dielectric layer 202. A second dielectric layer 204 is formed over the etch stop layer 203. Similar to the semiconductor structure 200 described above, the first material of the layer 210 may comprise a metal, for example copper and/or aluminum. These features may be formed by means of techniques similar to those described above with reference to FIGS. 2a-2b.

A first contact via 308 and a second contact via 310 are formed in the second dielectric layer 204. Thereafter, trenches 309, 311 may be formed. To this end, methods of photolithography and etching well known to persons skilled in the art may be employed. The formation of the trenches 309, 311 need not be performed after the formation of the contact vias 308, 310. In other embodiments, the contact vias 308, 310 may be formed after the formation of the trenches 309, 311.

After the formation of the contact vias 308, 310 and the trenches 309, 311, a layer 205 comprising a second material is formed over the semiconductor structure 300. The layer 205 may cover bottom surfaces of the contact vias 308, 310 and the trenches 309, 311 as well as sidewalls thereof. Additionally, the layer 205 may cover a portion of the surface of the second dielectric layer 204 between the trenches 309, 311. Similar to the embodiments described above with reference to FIGS. 2a-2b, the layer 205 may comprise a material adapted to substantially prevent a diffusion of the first material through the layer 205, such as titanium, titanium nitride, tantalum and/or tantalum nitride, and may, in some embodiments, comprise a plurality of sub-layers, wherein at least one of the sub-layers comprises the second material. In the formation of the layer 205, pores 312, 314 may form, in particular at the bottom of the contact vias 308, 310.

A layer 306 which may comprise the first material may be deposited over the layer 205 comprising the second material. For this purpose, known techniques of electroplating similar to those described above for the formation of the layer 211 comprising the first material may be employed. Similar to the method of manufacturing a semiconductor structure according to the state of the art described above with reference to FIGS. 1a-1b, the presence of the pores 312, 314 may induce a formation of voids 313, 315.

After the deposition of the layer 306, a planarization process, for example a chemical mechanical polishing process, may be performed in order to remove portions of the layer 306 comprising the first material and the layer 205 comprising the second material located outside the contact vias 308, 310 and the trenches 309, 311 from the semiconductor structure 300.

After the planarization process, the semiconductor structure 300 comprises an electrically conductive line 320 which is formed by the first material in the trenches 309, 307, 311 and the contact vias 308, 310, and wherein the contact vias 308, 310 are connected in series. In some embodiments, the semiconductor structure 300 may comprise further trenches and contact vias in addition to the trenches 309, 311, 307 and the contact vias 308, 310, wherein each of the trenches and contact vias is filled with the first material. The first material in the trenches and contact vias may provide an electrically conductive line. The arrangement of the contact vias and trenches may be such that the contact vias are connected in series. In some embodiments, the semiconductor structure 300 may comprise about 100 or more contact vias connected in series. In other embodiments, the semiconductor structure 300 may comprise about 1000 or more contact vias connected in series.

In some embodiments, an electric conductivity of the electrically conductive line 320 and/or a signal propagation delay of the electrically conductive line 320 may be measured using methods well known to persons skilled in the art. For this purpose, the electrically conductive line 320 may be connected to well-known electrical instruments such as a power source, an ampere meter and/or a voltmeter. Measuring electric properties such as conductivity and/or signal propagation delay of the electrically conductive line 320 may allow establishing a relationship between the electric properties of the electrically conductive line 320 and the presence and/or number of pores 312, 314 in the layer 205 comprising the second material.

Figure 3B:
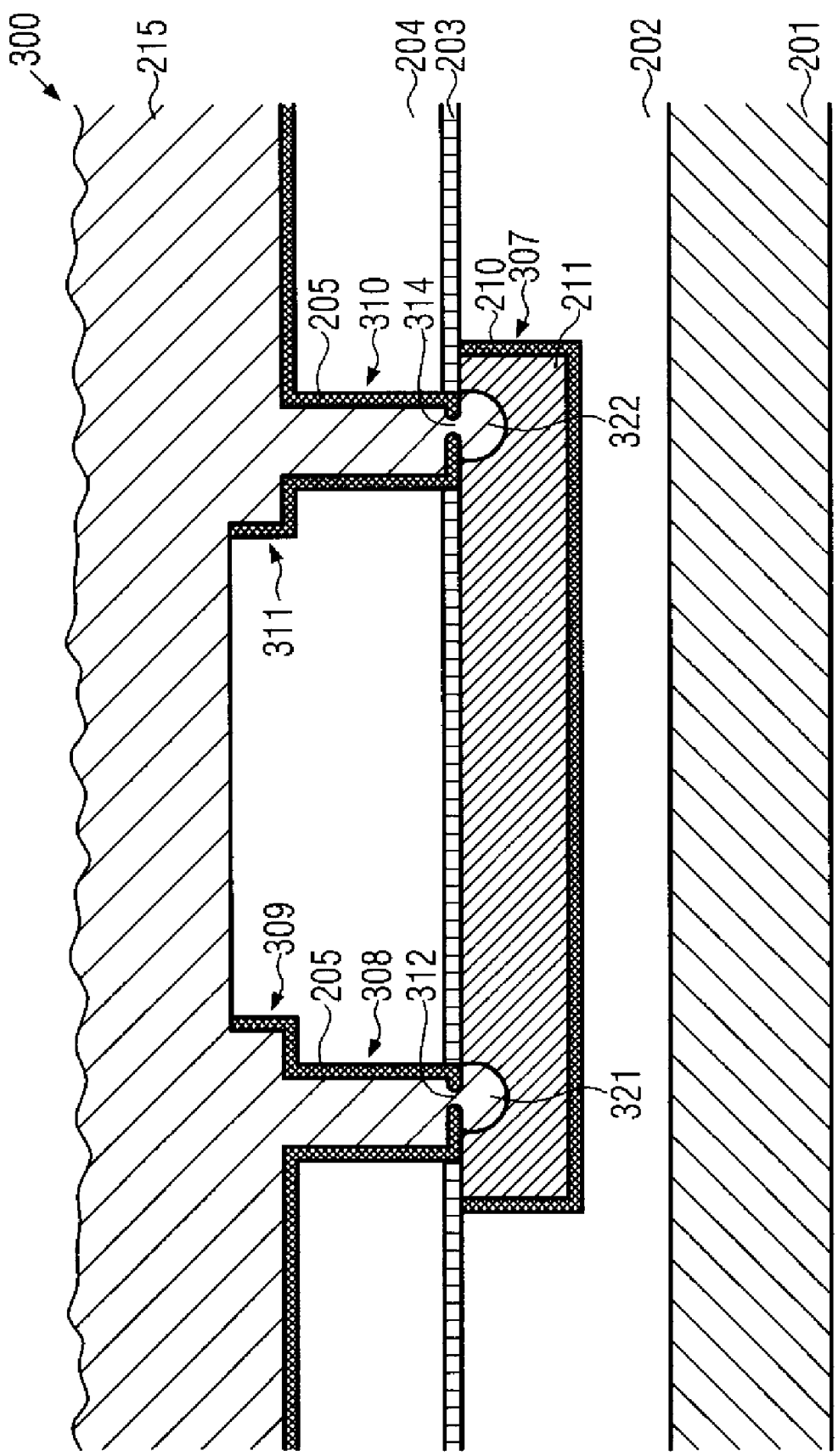

FIG. 3b shows a schematic cross-sectional view of the semiconductor structure 300 in a later stage of the method. The semiconductor structure 300 is exposed to an etchant 215 adapted to selectively remove the first material, leaving the second material substantially intact. Similar to the embodiments described above with reference to FIGS. 2a-2b, exposing the semiconductor structure 300 to the etchant may comprise performing a wet etching process, wherein the etchant 215 is provided in the form of a solution of a chemical compound adapted to react chemically with the first material, but not with the second material. For example, in embodiments wherein the first material comprises copper, the etchant may comprise an aqueous solution of ammoniumperoxidisulfate and/or iron(III)-chloride. In other embodiments, exposing the semiconductor structure 300 to the etchant 215 may comprise performing a dry etching process.

The etchant 215 may remove the layer 306 comprising the first material from the semiconductor structure 300. After the removal of the layer 306, the layer 205 comprising the second material is exposed on the surface of the semiconductor structure 300.

If the layer 205 comprises pores 312, 314, the etchant 215 may penetrate the pores 312, 314 and affect the first material of the layer 211 in the trench 307. Thus, similar to the embodiments described above with reference to FIGS. 2a-2b, cavities 321, 322 may form in the layer 211 of the first material below the pores 312, 314. If the layer 205, however, is substantially intact and does not comprise pores 312, 314, the layer 205 comprising the second material may protect the layer 211 from being affected by the etchant. Thus, no cavities 321, 322 are formed.

Similar to the embodiments described above with reference to FIGS. 2a-2b, after exposing the semiconductor structure 300 to the etchant, the semiconductor structure 300 may be inspected, for example, by means of optical microscopy and/or electron microscopy. While, in some embodiments, an inspection of the semiconductor structure 300 by means of electron microscopy may be performed using scanning electron microscopy, in other embodiments, transmission electron microscopy may be used. Moreover, similar to the embodiments described above with reference to FIGS. 2a-2b, a removal of the layer 205 and/or a dissection of the semiconductor structure 300 and/or a chemical mechanical polishing process may be performed prior to detecting whether the layer 211 comprising the first material has been affected by the etchant 215.

In some embodiments, each of the contact vias 308, 310 may be viewed in order to determine whether a cavity 320, 321 has been formed. Thus, a likelihood of the occurrence of pores 312, 314 at the bottom of the contact vias 308, 310 can be determined. In particular, in embodiments wherein more than about 100, or more than about 1000, contact vias are formed, statistical properties such as the probability of one of the contact vias comprising a pore 312, 314 may be determined with a relatively high accuracy. In order to inspect each of the contact vias, an image of each of the contact vias may be made by means of optical and/or electron microscopy. Thereafter, image processing techniques well known to persons skilled in the art may be employed in order to automatically detect the presence of cavities 320, 321. In other embodiments, some or all of the contact vias 308, 310 may be inspected manually.

The present invention is not restricted to embodiments wherein the semiconductor structure 300 is exposed to the etchant 215 after depositing the layer 306 comprising the first material and performing the chemical mechanical polishing process. In other embodiments, the deposition of the layer 306 and/or the chemical mechanical polishing process may be omitted.

In some embodiments, the method described above with reference to FIGS. 3a-3b may be performed for each of a plurality of semiconductor structures similar to the semiconductor structure 300, wherein one or more of the semiconductor structures comprises a different density of contact vias than other ones of the semiconductor structures. Thus, an influence of the density of contact vias on the integrity of the layer 205 in the contact vias may be investigated.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a semiconductor structure, said semiconductor structure comprising a feature comprising a first material, a dielectric layer formed over said feature, and a layer comprising a second material formed over said feature, wherein said dielectric layer comprises a contact via formed therein, said contact via being located over said feature;
filling said contact via with said first material;
after filling said contact via with said first material, exposing said semiconductor structure to an etchant, said etchant being adapted to selectively remove said first material relative to said second material; and
after exposing said semiconductor structure to said etchant, detecting whether said feature has been etched by said etchant.

2. The method of claim 1, wherein said etchant is adapted to leave said second material substantially intact.

3. The method of claim 1, wherein said first material comprises a metal.

4. The method of claim 3, wherein said metal comprises copper.

5. The method of claim 1, wherein said second material comprises at least one of titanium, tantalum, titanium nitride and tantalum nitride.

6. The method of claim 1, wherein said layer comprising said second material is formed over at least a bottom surface of said contact via.

7. The method of claim 1, wherein said feature comprises a trench filled with said first material.

8. The method of claim 1, further comprising forming a trench in said dielectric layer, said trench being located over said feature.

9. The method of claim 8, further comprising filling said contact via and said trench with said first material prior to exposing said semiconductor structure to said etchant.

10. The method of claim 1, wherein exposing said semiconductor structure to said etchant comprises performing a wet etch process.

11. The method of claim 10, wherein said etchant comprises at least one of ammoniumperoxidisulfate and iron(III)-chloride.

12. The method of claim 1, wherein detecting whether said feature has been etched by said etchant comprises performing at least one of electron microscopy and optical microscopy.

13. The method of claim 1, further comprising dissecting said semiconductor structure prior to detecting whether said feature has been etched by said etchant.

14. The method of claim 1, further comprising performing a chemical mechanical polishing process prior to detecting whether said feature has been affected by said etchant.

15. A method, comprising:
providing a semiconductor structure, said semiconductor structure comprising:
a substrate;
an electrically conductive feature formed in said substrate, said electrically conductive feature comprising a first material;
a dielectric layer formed over said substrate;
a contact via formed in said dielectric layer; and
a barrier layer formed over at least a portion of said feature at a bottom of said contact via, said barrier layer comprising a second material;
forming a layer comprising said first material over said barrier layer;
after forming said layer comprising said first material over said barrier layer, exposing said semiconductor structure to an etchant, said etchant being adapted to selectively remove said first material relative to said second material; and
after exposing said semiconductor structure to said etchant, detecting whether said feature has been etched by said etchant.

16. The method of claim 15, further comprising performing a planarization process adapted to remove portions of said layer of said first material prior to exposing said semiconductor structure to said etchant.

17. The method of claim 15, wherein said detecting whether said feature has been etched by said etchant comprises performing at least one of scanning electron microscopy and optical microscopy.

18. The method of claim 15, wherein said semiconductor structure comprises a plurality of contact vias, and wherein said electrically conductive feature and said layer of said first material are adapted to electrically connect at least two of said contact vias in series.

* * * * *